United States Patent
Hwang

(10) Patent No.: US 6,724,641 B1
(45) Date of Patent: Apr. 20, 2004

(54) SHIELDING CAGE ASSEMBLY ADAPTED FOR MULTIPLE TRANSCEIVER MODULES

(75) Inventor: Jenq-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/324,332

(22) Filed: Dec. 18, 2002

Related U.S. Application Data

(63) Continuation-in-part of application No. 29/169,366, filed on Oct. 17, 2002.

(51) Int. Cl.$^7$ .............................. H05K 9/00; H05K 7/16
(52) U.S. Cl. ...................... 361/818; 361/816; 361/726; 361/727; 174/35 R
(58) Field of Search ................... 361/683–686, 361/724–432, 740–742, 747, 752, 753, 756, 758, 759, 799–802, 804, 807, 814, 816, 818; 174/35 R, 35 MS, 50, 50.52; 439/607, 608, 939; 385/88, 89, 92, 94; 312/223.2, 223.3; 211/41.17

(56) References Cited

U.S. PATENT DOCUMENTS

| | | | | |
|---|---|---|---|---|
| 5,394,305 A | * | 2/1995 | Moral et al. ................. | 361/796 |
| 5,859,767 A | * | 1/1999 | Fontana ....................... | 361/818 |
| 6,047,172 A | * | 4/2000 | Babineau et al. ........... | 455/300 |
| 6,115,263 A | * | 9/2000 | Babineau et al. ........... | 361/796 |
| 6,149,465 A | * | 11/2000 | Berg et al. ................... | 439/630 |
| 6,154,361 A | * | 11/2000 | Anderson et al. ........... | 361/685 |
| 6,276,963 B1 | * | 8/2001 | Avery et al. ............. | 439/541.5 |
| 6,558,191 B2 | * | 5/2003 | Bright et al. ............ | 439/541.5 |

OTHER PUBLICATIONS

Application 29/169366 filed Oct. 17, 2002.*

* cited by examiner

*Primary Examiner*—Phuong T. Vu
(74) *Attorney, Agent, or Firm*—Wei Te Chung

(57) ABSTRACT

A shielding cage assembly (10) for shielding a plurality of transceiver modules therein includes a conductive body cage (1), a conductive cover cage (2) and a plurality of dividing walls (3), which cooperatively define a plurality of hollowed spaces for receiving the transceiver modules therein. Retaining tabs (121), (311) are respectively formed on the body cage and the dividing walls, and engage in a corresponding plurality of slots (24a, 24) defined in the cover cage to hold with the cover cage to the body cage and to fix the dividing walls between the cover cage and body cage.

15 Claims, 3 Drawing Sheets

SHIELDING CAGE ASSEMBLY ADAPTED FOR MULTIPLE TRANSCEIVER MODULES

This is a continuation-in-part of the copending application Ser. No. 29/169,366 filed on Oct. 17, 2002.

BACKGROUND OF THE INVENTION

1. Field of the Invention

This invention relates generally to a shielding cage for shielding components from electromagnetic interference and more particularly to a shielding cage assembly for arranging a plurality of transceiver modules therein.

2. Description of the Related Art

A transceiver module is a discrete unit used in interface communications equipment, and is normally singly received in a cage that provides shielding against electromagnetic interference (EMI). Prior art shielded transceiver modules are too difficult to assemble densely to a circuit board. Therefore, an improved inexpensive shielding cage assembly that will allow transceiver modules to be easily and densely mounted on a circuit board is desired.

SUMMARY OF THE INVENTION

An object of the present invention is to provide a shielding cage assembly for receiving a plurality of transceiver modules therein.

A shielding cage assembly according to the present invention includes a conductive body cage, a conductive cover cage and a plurality of dividing walls, which cooperatively define a plurality of hollowed spaces for receiving transceiver modules therein. Retaining tabs are respectively formed on the body cage and the dividing walls, and engage in a corresponding plurality of slots defined in the cover cage to hold the cover cage to the body cage and to fix the dividing walls between the cover cage and body cage.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
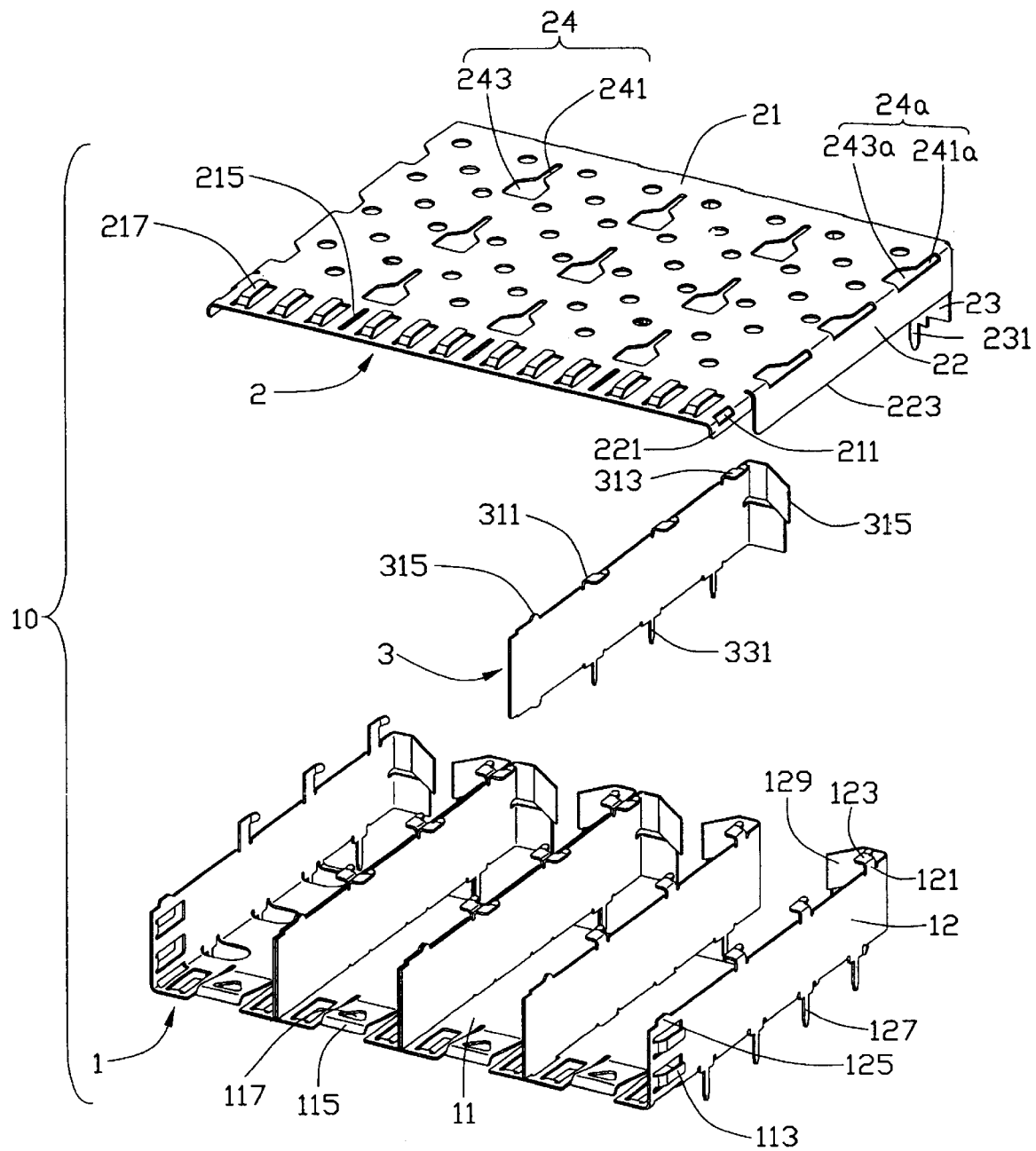
FIG. 1 is an exploded view of the shielding cage assembly in accordance with the present invention.

Referring to FIG. 1, a shielding cage assembly 10 in accordance with the present invention is made of electrically conductive material and comprises a conductive body cage 1, a conductive cover cage 2, and a plurality of conductive dividing walls 3 for receiving multiple transceiver modules (not shown) therein.

Figure 2:
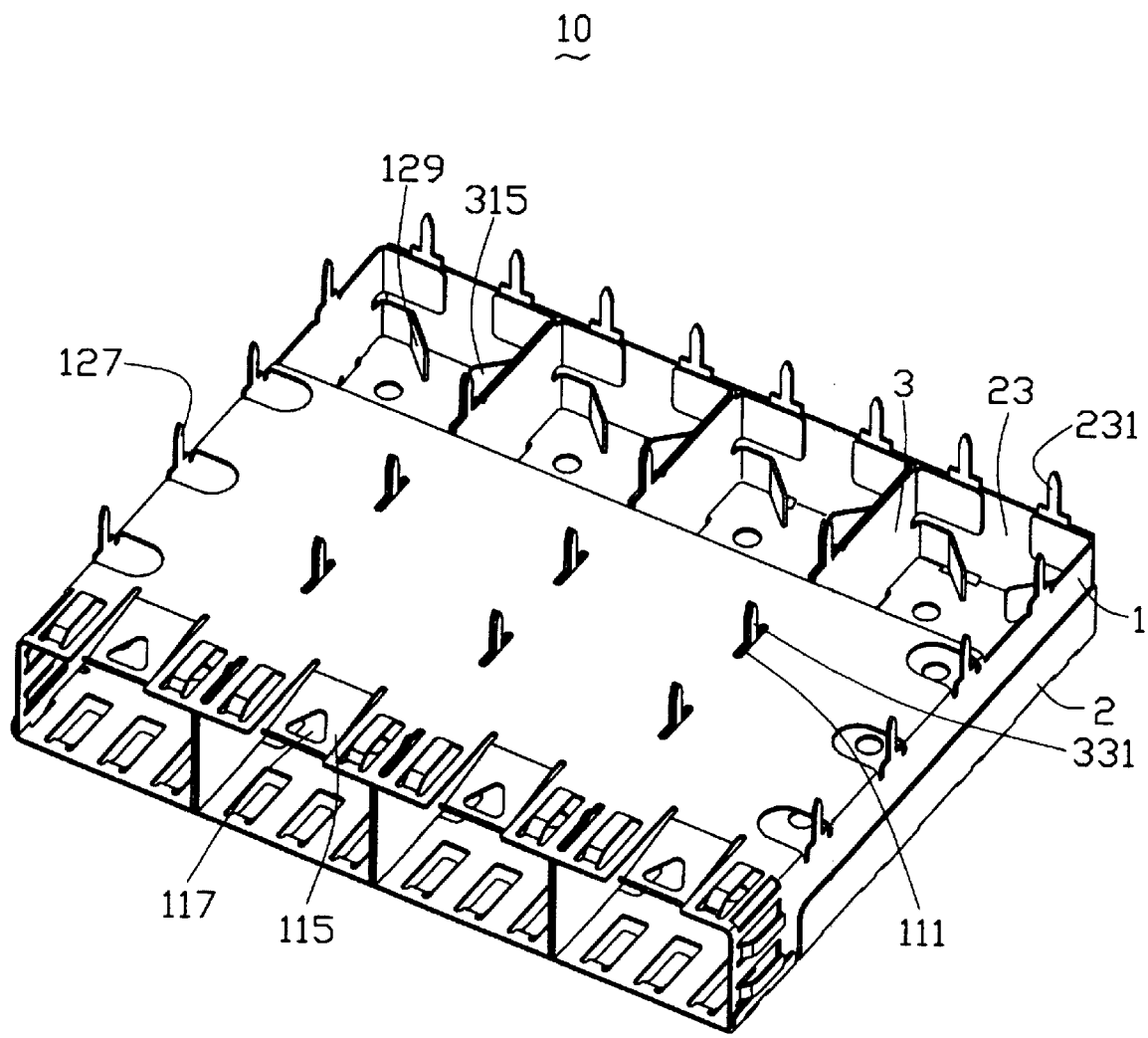
FIG. 2 is an assembled view of FIG. 1 from a bottom-side aspect.

Referring also to FIG. 2, the body cage 1 includes a bottom wall 11 and two side walls 12 extending upwardly therefrom. A plurality of notches 111 is defined through the bottom wall 11 arranged in parallel lines in a frontward to rearward direction. A plurality of retaining tabs 121 extends upwardly and inwardly from upper edges (not labeled) of the side walls 12, a top portion of each retaining tab 121 being curved inwardly in a horizontal direction to form an engaging surface 123. A soldering tab 125 extends upwardly from a front end of the upper edge of each side wall 12. For the sake of EMI suppression, a plurality of spring tabs 113 is formed at the front end of the bottom wall 11 and the side walls 12. A plurality of releasing tabs 115 extends upwardly at an angle from the bottom wall 11, each releasing tab 115 defining a triangular shaped opening 117 therethrough for securing a transceiver module in the shielding cage assembly 10. The releasing tab 115 can be depressed to remove a transceiver module from the shielding cage assembly 10. A plurality of mounting pins 127 extends downwardly from bottom edges of the side walls 12. A curved ground tab 129 extends inwardly from a rearward edge of each side wall 12 of the body cage 1.

Each dividing wall 3 is elongated in shape and includes a plurality of retaining tabs 311 and a stopper 315 projecting upwardly from an upper edge thereof, a curved ground tab 335 projecting sidewardly and forwardly from a rear edge thereof, and a plurality of mounting pins 331 extending downwardly from a bottom edge thereof. The dividing walls 3 come in complementary pairs, each member of a pair being the mirror-image of the other. The retaining tabs 311 of each pair have the same shape as the retaining tabs 121 of the body cage 1.

Referring to FIGS. 1 and 2, the cover cage 2 includes a top wall 21 with two side walls 22 and a back panel 23 respectively extending downwardly from two side and a rear edges of the top wall 21. Each side wall 22 includes a front side wall 221 and a rear side wall 223. The rear side wall 223 is longer than the front side wall 221, and overlaps much of the side wall 12 of the body cage 1 when the cover cage 2 is attached to the body cage 1. A plurality of slots 24 is defined through the top wall 21, arranged in parallel lines in a frontward to rearward direction. Another plurality of slots 24a is located at an intersection of the top wall 21 and each side wall 22. Each slot 24, 24a has a seam portion 241, 241a and an enlarged opening 243, 243a in communication with the seam portion 241, 241a. Each opening 243 is larger in size than the engaging surfaces 313 of two retaining tabs 311 placed back-to-back. Each opening 243a is larger in size than the engaging surface 123 of the retaining tab 121. The mounting pins 331 of each complementary pair of dividing walls 3 are engaged in corresponding notches 111 of the body cage 1. A pair of short slots 211 is defined in the front side walls 221 to accept the soldering tabs 125 of the body cage 1. A plurality of cutouts 215 is defined near the front edge of the top wall 21 to accept corresponding pairs of stoppers 315 of the complementary pairs of dividing walls 3. A plurality of spring tabs 217 extends upwardly near the front edge of top wall 21 of the cover cage 2 for EMI suppression. A plurality of mounting pins 231 extends downwardly from the back panel 23 of the cover cage 2.

Figure 3:
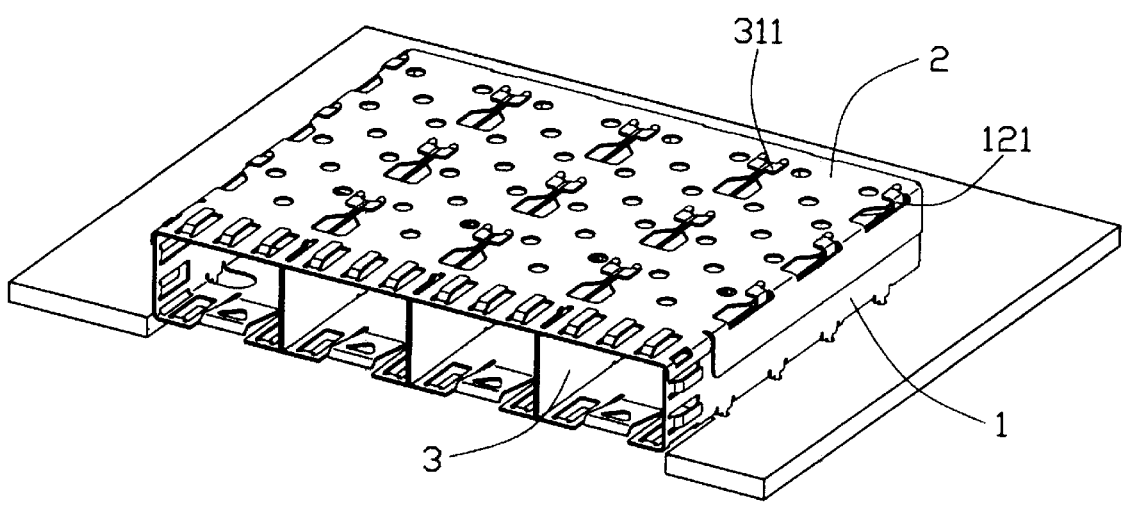
FIG. 3 is a perspective view of the shielding cage assembly mounted to a printed circuit board.

Referring to FIGS. 1, 2 and 3, in assembly, complementary dividing walls 3 are placed back-to-back, the mounting pins 331 of each pair are engaged in corresponding notches 111 of the body cage 1. Next the cover cage 2 and the body cage 1 are engaged together. The retaining tabs 311, 121 pass through the corresponding openings 243, 243a, and then the cover cage 2 is fully pushed forward on the body cage 1 so that the seam portions 241, 241a of the slots 24, 24a fixedly engage with the retaining tabs 311, 121. The soldering tabs 125, which protrude through corresponding short slots 211, are soldered to the cover cage 2, completing assembly of the shielding cage assembly 10. The plurality of hollowed spaces formed within the shielding cage assembly 10 can receive a plurality of transceiver modules therein. The shielding cage assembly 10 is mounted to a printed circuit board (not labeled) with the mounting pins 127, 231, 331 being respectively received within mounting holes of the printed circuit board, where they can be soldered or otherwise fixed therein. For instance, in order to improve the stability of the shielding cage assembly 10 mounted on the printed circuit board, the mounting pins 127, 231, 331 of the shielding cage assembly 10 can be made larger than the mounting holes (not shown) of the printed circuit board with each mounting pin defining a needle eye therethrough, to create an interference fit between the mounting pins and the printed circuit board mounting holes.

Although the present invention has been described with specific terms, it should be noted that the described embodiments are not necessarily exclusive, and that various changes and modifications may be made thereto without departing from the scope of the present invention as defined in the appended claims.

I claim:

1. A shielding cage assembly for accommodating a plurality of transceiver modules, comprising:
    a body cage including an electrically conductive bottom wall and two electrically conductive side walls;
    a plurality of electrically conductive dividing walls arranged in said body cage, cooperating with said body cage side walls to form a plurality of channels therein; and
    an electrically conductive cover cage engaging with said body cage to form a plurality of hollow spaces between the bottom wall, side walls, dividing walls and cover cage for receiving transceiver modules therein wherein a plurality of retaining members extend from upper edges of said body cage side walls and said dividing walls, respectively and wherein a plurality of slots is defined through said cover case to accept the retaining members of the body case side walls and dividing walls wherein each slot has a seam portion and an enlarged opening in communication with the seam portion.

2. The shielding cage assembly as claimed in claim 1, wherein said cover cage, body cage side walls and dividing walls further include a plurality of mounting pins extending from bottom edge thereof.

3. The shielding cage assembly as claimed in claim 2, wherein said body cage further includes a plurality of notches defined through the bottom wall to accept corresponding mounting pins of the dividing walls.

4. The shielding cage assembly as claimed in claim 1, wherein the dividing walls are arranged in complementary pairs, and member dividing walls of each pair are abutting back-to-back.

5. The shielding cage assembly as claimed in claim 1, wherein each of said body cage side walls further includes a soldering tab extending from an upper edge thereof.

6. The shielding cage assembly as claimed in claim 5, wherein said cover cage further includes a pair of short slots to accept the solder tabs therein.

7. The shielding cage assembly as claimed in claim 1, wherein a plurality of spring tabs extends outwardly from the body cage and the cover cage for EMI suppression.

8. The shielding cage assembly as claimed in claim 1, wherein said cover cage has a pair of front side walls and rear side walls.

9. A shielding cage assembly for accommodating a plurality of electronic or optoelectronic components therein, comprising:
    a conductive cage; and
    a plurality of vertical inner partitions arranged in said conductive cage forming a plurality of hollow spaces therebetween for receiving the electronic or optoelectronic components therein wherein said conductive cage includes a cover portion and a body portion and the cover portion includes a plurality of slots in alignment with and engaging a corresponding plurality of retaining elements extending from said body portion and said vertical inner partitions where each slot has a seam portion and an enlarged opening in communication with the seam portion.

10. The shielding cage assembly as claimed in claim 9, wherein a plurality of mounting pins extends from said conductive cage and vertical inner partitions for being received in mounting holes of a circuit board.

11. The shielding cage assembly as claimed in claim 10, wherein said mounting pins are larger than said circuit board mounting holes, so as to create an interference fit between said mounting pins and said circuit board mounting holes.

12. The shielding cage assembly as claimed in claim 9, wherein said vertical inner partitions are removable from said conductive cage.

13. The shielding cage assembly as claimed in claim 9, wherein each hollow spaces is identical.

14. The shielding cage assembly as claimed in claim 9, further including a plurality of EMI suppression tabs formed on said conductive cage.

15. A shielding cage assembly for receiving a plurality of modules therein, comprising:
    a lower cage including a bottom wall;
    a plurality of releasing tabs formed on a front edge section of the bottom wall;
    an upper cage located above the lower cage parallel to the lower cage and cooperating with the lower cage to define a space therebetween;
    two side walls located on two sides of said lower cage and said upper cage, each of said side walls extending from one of said lower cage and said upper cage to engage the other and securing the lower cage and the upper cage together;
    a plurality of dividing walls discrete from but perpendicularly extending between said lower cage and said upper cage, each of said dividing walls defining two opposite ends respectively engaged with the lower cage and the upper cage and securing each of said dividing walls to both said lower cage and said upper cage; wherein
    said dividing walls separate said space into a plurality channels, and each of said channels is equipped with one of said release tabs for releasably and latchably receiving one of said modules therein wherein said upper cage includes a plurality of slots in alignment with and engaging a corresponding plurality of retaining elements extending from said two side walls and said plurality of dividing walls where each slot has a seam portion and an enlarged opening in communication with the seam portion.

* * * * *